US006816529B2

(12) United States Patent
Vail et al.

(10) Patent No.: US 6,816,529 B2
(45) Date of Patent: Nov. 9, 2004

(54) HIGH SPEED MODULATION OF ARRAYED LASERS

(75) Inventors: Edward C. Vail, Fremont, CA (US);
Jay Kubicky, Fremont, CA (US);
Bardia Pezeshki, Redwood City, CA (US)

(73) Assignee: Santur Corporation, Fremont, CA (US)

( * ) Notice: Subject to any disclaimer, the term of this patent is extended or adjusted under 35 U.S.C. 154(b) by 0 days.

(21) Appl. No.: 10/114,851

(22) Filed: Apr. 1, 2002

(65) Prior Publication Data

US 2002/0181533 A1 Dec. 5, 2002

Related U.S. Application Data

(60) Provisional application No. 60/280,217, filed on Mar. 30, 2001, provisional application No. 60/280,069, filed on Mar. 30, 2001, provisional application No. 60/280,098, filed on Mar. 30, 2001, and provisional application No. 60/280,422, filed on Mar. 30, 2001.

(51) Int. Cl.[7] .................................................. H01S 5/00
(52) U.S. Cl. ..................................... 372/50; 372/38.02
(58) Field of Search ............................... 372/50, 3, 23, 372/34, 5, 20, 109, 31, 29.011, 29.013–29.015, 38.02, 38.06, 26, 38.03, 29.021, 92, 38.07; 369/116

(56) References Cited

U.S. PATENT DOCUMENTS

| | | | | |
|---|---|---|---|---|
| 4,009,385 A | * | 2/1977 | Sell ........................... | 372/38.07 |
| 4,317,611 A | | 3/1982 | Petersen | |
| 4,359,773 A | * | 11/1982 | Swartz et al. .................. | 372/26 |
| 4,498,730 A | | 2/1985 | Tanaka et al. | |
| 4,796,266 A | * | 1/1989 | Banwell et al. ........ | 372/29.021 |

(List continued on next page.)

FOREIGN PATENT DOCUMENTS

| | | |
|---|---|---|
| FR | 2805092 | 8/2001 |
| WO | WO 02/13343 A2 | 2/2002 |
| WO | WO 02/37069 | 5/2002 |
| WO | WO 02/37621 A2 | 5/2002 |
| WO | WO 02/058197 A2 | 7/2002 |
| WO | WO 02/013343 A3 | 7/2003 |

OTHER PUBLICATIONS

International Search Report dated Jun. 16, 2002 for International Application No. PCT/US02/10461, mailed Aug. 27, 2002 (3 pages).
"Broadband Lightwave Sources and System", Gayton Photonics Ltd., http://www.infowin.org/ACTS/RUS/PROJECTS/ac065.htm, printed Oct. 17, 2000 (4 pages).
Dellunde, Jaume, "Laser diodes", http://www.geocities-.com/jdellund/receng.htm, printed Aug. 8, 2001 (4 pages).
Hunter, D.K., et al., "Guided wave optical switch architectures. Part 1. Space switching", International Journal of Optoelectronics, vol. 9, No. 6, 1994 (pp. 477–487).
Solgaard, O., et al., "Optoelectronic Packaging Using Silicon Surface–Micromachined Alignment Mirrors", IEEE Photonics Technology Letters, vol. 7, No. 1, 1995 (pp. 41–43) (4 pages total).
Li, G.P., et al., "16–Wavelength Gain–Coupled DFB Laser Array with Fine Tunability", IEEE Photonics Technology Letters, vol. 8, No. 1, Jan. 1996 (pp. 22–24).
Gordon, C., "Hybrid Mode–Locked DBR–laser", Multidisciplinary Optical Switching Technology Center, http://www.ece.ucsb.edu/MOST/33.html, (last updated Jan. 22, 1996), printed Aug. 5, 2001 (3 pages).

(List continued on next page.)

Primary Examiner—Don Wong
Assistant Examiner—Tuan N. Nguyen
(74) Attorney, Agent, or Firm—Christie, Parker & Hale, LLP

(57) ABSTRACT

A photonic device and modulating drive circuits. In one aspect the device is an array of lasers with modulator circuits for modulating a single selectable laser of the array of lasers.

65 Claims, 12 Drawing Sheets

U.S. PATENT DOCUMENTS

| | | | |
|---|---|---|---|
| 5,136,598 A | | 8/1992 | Weller et al. |
| 5,274,489 A | | 12/1993 | Smith et al. |
| 5,283,796 A | | 2/1994 | Fink |
| 5,291,502 A | | 3/1994 | Pezeshki et al. |
| 5,305,338 A | * | 4/1994 | Wakata et al. ........... 372/38.03 |
| 5,378,330 A | | 1/1995 | Li et al. |
| 5,379,310 A | | 1/1995 | Papen et al. |
| 5,394,489 A | * | 2/1995 | Koch ........................ 385/14 |
| 5,412,675 A | * | 5/1995 | Odagawa ............... 372/29.021 |
| 5,428,635 A | * | 6/1995 | Zhiglinsky et al. ........... 372/92 |
| 5,468,975 A | | 11/1995 | Valster |
| 5,504,609 A | | 4/1996 | Alexander et al. |
| 5,515,196 A | | 5/1996 | Kitajima et al. |
| 5,612,968 A | | 3/1997 | Zah |
| 5,629,790 A | | 5/1997 | Neukermans et al. |
| 5,771,253 A | | 6/1998 | Chang-Hasnain et al. |
| 5,777,763 A | | 7/1998 | Tomlinson, III |
| 5,798,859 A | | 8/1998 | Colbourne et al. |
| 5,825,792 A | | 10/1998 | Villeneuve et al. |
| 5,882,468 A | | 3/1999 | Crockett et al. |
| 5,930,045 A | | 7/1999 | Shirasaki |
| 5,949,544 A | | 9/1999 | Manning |
| 5,953,359 A | | 9/1999 | Yamaguchi et al. |
| 5,969,479 A | * | 10/1999 | Wong ..................... 315/200 A |
| 5,977,567 A | | 11/1999 | Verdiell |
| 5,978,402 A | | 11/1999 | Matsumoto et al. |
| 5,987,044 A | * | 11/1999 | Odagawa et al. ........ 372/38.02 |
| 5,999,303 A | | 12/1999 | Drake |
| 5,999,545 A | | 12/1999 | Jeon et al. |
| 6,049,554 A | | 4/2000 | Lang et al. |
| 6,078,394 A | | 6/2000 | Wood |
| 6,091,537 A | | 7/2000 | Sun et al. |
| 6,091,747 A | | 7/2000 | Morita et al. |
| 6,133,615 A | | 10/2000 | Guckel et al. |
| 6,134,250 A | * | 10/2000 | Koren et al. ................... 372/6 |
| 6,150,667 A | | 11/2000 | Ishizaka et al. |
| 6,175,668 B1 | | 1/2001 | Borrelli et al. |
| 6,201,629 B1 | | 3/2001 | McClelland et al. |
| 6,212,151 B1 | | 4/2001 | Heanue et al. |
| 6,229,270 B1 | * | 5/2001 | Stephenson et al. ........ 315/291 |
| 6,256,328 B1 | | 7/2001 | Delfyett et al. |
| 6,275,315 B1 | | 8/2001 | Park et al. |
| 6,295,308 B1 | | 9/2001 | Zah |
| 6,316,764 B2 | | 11/2001 | Heffner et al. |
| 6,327,063 B1 | | 12/2001 | Rockwell |
| 6,350,064 B2 | | 2/2002 | Mitsuda et al. |
| 6,352,376 B2 | | 3/2002 | Walters et al. |
| 6,445,670 B1 | * | 9/2002 | Oshima ...................... 369/116 |
| 6,516,017 B1 | * | 2/2003 | Matsumoto .................. 372/50 |
| 6,553,044 B1 | * | 4/2003 | Eden ...................... 372/38.02 |
| 6,563,849 B2 | * | 5/2003 | Mizuno ................... 372/38.02 |
| 6,594,050 B2 | * | 7/2003 | Jannson et al. ............... 398/52 |
| 6,639,924 B2 | * | 10/2003 | Kato et al. ............... 372/38.02 |
| 2001/0017876 A1 | | 8/2001 | Kner et al. |
| 2001/0036206 A1 | | 11/2001 | Jerman et al. |
| 2001/0050928 A1 | | 12/2001 | Cayrefourcq et al. |
| 2002/0064192 A1 | | 5/2002 | Missey et al. |

OTHER PUBLICATIONS

Daneman,.M. J., et al., "Laser–to–Fiber Coupling Module Using a Micromachined Alignment Mirror", IEEE Photonics Technology Letters, vol. 8, No. 3, Mar. 1996 (pp. 396–398).

Wu, M., "Micromachining for Optical and Optoelectronic Systems", Proceedings of the IEEE, vol. 85, No. 11, Nov. 1997 (pp. 1833, 1943–1952).

Jacques, S., "Phase conjugate mirror and diffraction grating yield stable, collimated, coherent, high–power diode laser.", Oregon Medical Laser Center Newsletter, http://omlc.ogi.edu/news/dec97/pclaser.html, printed Apr. 9, 2001, (2 pages).

Shirasaki, M., "Chromatic–Dispersion Compensator Using Virtually Imaged Phased Array", IEEE Photonics Technology Letters, vol. 9, No. 12, Dec. 1997 (pp. 1598–1600).

Kudo, K., et al., "Multiwavelength microarray semiconductor lasers", Electronics Letters, vol. 34, No. 21, Oct. 15, 1998, (pp. 2037–2039).

Kopka, P., et al., "Bistable 2×2 and Multistable 1×4 Micromechanical Fibre–optic Switches on Silicon", Micro Opto Electro Mechanical Systems, MOEMS 1999 (4 pages).

Olof, S., "DWDM Lasers Fashion Networks of the Future", FibreSystems, Sep. 1999 (pp. 41–44).

"(BW)(OH–MARCONI–COMM–2) Marconi Communications Announces World–Beating Commercial Tuneable Laser at Telecom '99", Press Release, http://www.businesswire.com./cgi–bin/ts_headline.sh?/bw.101199/192842212, Oct. 11, 1999. printed Oct. 17, 2000 (2 pages).

Maluf, N., "Optical switches", An Introduction to Microelectromechanical Systems Engineering, 2000, pp. 187–190 (3 pages).

Nakano, H., "Technological Trends of Optical Communication Devices for DWDM", NEC Device Technology International 2000, No. 59 (5 pages).

Liu, F., et al., "Cost–effective wavelength selectable light source using DFB fibre laser array", Electronics Letters, vol. 36, No. 7, Mar. 30, 2000, pp. 620–621, (3 pages).

Hunwicks, A., "Advancing the Optical Component", http://www.telecomsmag.com/issues/200004/tci/advancing.html, Apr. 2000, printed Oct. 17, 2000 (6 pages).

Pezeshki, B., et al., "12nm tunable WDM source using an integrated laser array", Electronics Letters, vol. 36, No. 9, Apr. 27, 2000 (pp. 788–789).

Howe, P., "Light fantastic", digitalMASS at Boston.com, http://digitalmass.boston.com/news/daily/05/22/light_fantastic.html, printed Oct. 17, 2000 (5 pages).

Silverman, S., "Vcs beam big bucks at optics upstarts", Redherring.com, Oct. 9, 2000, http://www.redherring.com/vc/2000/1009/vc–optics100900.html?id=yahoo, printed Oct. 10, 2000 (5 pages).

* cited by examiner

HIGH SPEED MODULATION OF ARRAYED LASERS

CROSS-REFERENCE TO RELATED APPLICATIONS

This application claims the benefit of U.S. Provisional Application No. 60/280,217, entitled HIGH SPEED MODULATION OF ARRAYED TUNABLE LASERS, filed Mar. 30, 2001; U.S. Provisional Application No. 60/280,069, entitled DIRECT MODULATION OF LASER ARRAY USING SWITCHED LASER ACTIVATION, filed Mar. 30, 2001; U.S. Provisional Application No. 60/280,098, entitled DIRECT MODULATION OF LASER ARRAY USING SWITCHED LASER ACTIVATION WITH EXTERNAL CAPACITANCE, filed March 30 2001; and U.S. Provisional Application No. 60/280,422, entitled MODULATION OF LASER ARRAY USING SWITCHED DC CURRENT, filed Mar. 30, 2001, the disclosures of which are incorporated herein by reference.

BACKGROUND

The present invention relates generally to data communication lasers, and more specifically to modulation of arrayed lasers.

Lasers are often used for data communication. Commonly the lasers are distributed feedback (DFB) lasers, although distributed Bragg reflecting (DBR) lasers, vertical cavity surface emitting lasers (VCSELs), and others may be used. The light emitted from lasers is used to form data signals, with light approximate a first level indicating a logical high signal and light approximate a second level, generally a very low level, indicating a logical low signal. The light is generally passed through a fiber optic line as a transmission media to a receiver.

Often the lasers emit light at a constant level, generally a high level, and the light is thereafter modulated to form a data signal. In such instances the modulation is often performed by an external modulator, such as an electro-absorption modulator or a lithium niobate Mach-Zehnder modulator. The use of a separate modulator, however, adds to system cost. Moreover, the benefits to signal quality provided by the use of a separate modulator may be unnecessary in some applications, particularly where length of signal travel is not overly great. An example of such applications would be metro communication rings. In such applications it may be more economical to directly modulate laser operation.

In some applications it is useful to provide multiple lasers on a single substrate. For example, in some applications transmission system reliability is an important consideration, as is transmission system time between failures. Failure of a laser, for example, may result in failure of the transmission system, and lasers may exhibit greater failure rates than other components. Further, in some applications, replacement of failed components may be difficult and time consuming. Accordingly, the use of multiple lasers, with some of the lasers serving as spares in the event of failure of a primary laser, is sometimes beneficial.

At times, multiple lasers may be provided on a single substrate. Providing multiple lasers on a single substrate, forming an array of lasers, is beneficial as manufacture of the lasers may be accomplished in an economical manner, and packaging of the lasers does not require undue space. However, in applications where the laser is directly modulated, modulation of a single laser may be desired. Common methods of directly modulating single lasers may be more difficult when an array of lasers on a common substrate is provided.

BRIEF SUMMARY OF THE INVENTION

The present invention provides photonic devices and circuits for use with photonic devices. In one aspect of the invention a photonic device is provided. The photonic device comprises an array of lasers on a common substrate; a drive switch adapted to selectively provide a current to a laser of the array of lasers; and a data switch coupling the common substrate to a ground based on a high speed data signal received by the data switch.

In another aspect the invention comprises a drive circuit for a tunable laser, the tunable laser comprising an array of lasers configured to lase at different wavelengths, the lasers being provided on a common substrate, light from a single selectable laser being coupled to an optical output using a moveable mirror, the drive circuit operating to modulate the light from a selected laser so as to carry a high speed data signal, the drive circuit comprising a switch coupling the common substrate to a low voltage level when the switch is in a first state, the state of the switch depending on a data signal received by the switch; and a drive switch providing a drive signal to the selected laser, based on a laser selection signal received by the drive switch, the drive signal charging a capacitor coupled to the selected laser, with the capacitor causing the selected laser to lase when the switch couples the common substrate to a low voltage.

In another aspect the invention comprises a drive circuit for a tunable laser, the tunable laser comprising an array of lasers configured to lase at different wavelengths, the lasers being provided on a common substrate, light from a single selectable laser being coupled to an optical output using a moveable mirror, the drive circuit operating to modulate the light from a selected laser so as to carry a high speed data signal, the drive circuit comprising a data line coupling a data signal to the lasers; and a drive switch providing a bias signal to a selected laser, based on a laser selection signal received by the drive switch, the bias signal in combination with the data signal to lase in accordance with the data signal.

In another aspect the invention comprises a photonic device comprising an array of lasers, the lasers being semiconductor diode lasers; a switch to bias one of the lasers with a dc current such that the one of the lasers lases; and means to apply an ac data signal to all of the lasers, whereby current to the one of the lasers is modulated by the ac data signal.

These and other aspects of the invention will be more fully comprehended upon study of this disclosure including the associated figures.

DETAILED DESCRIPTION

Figure 1:
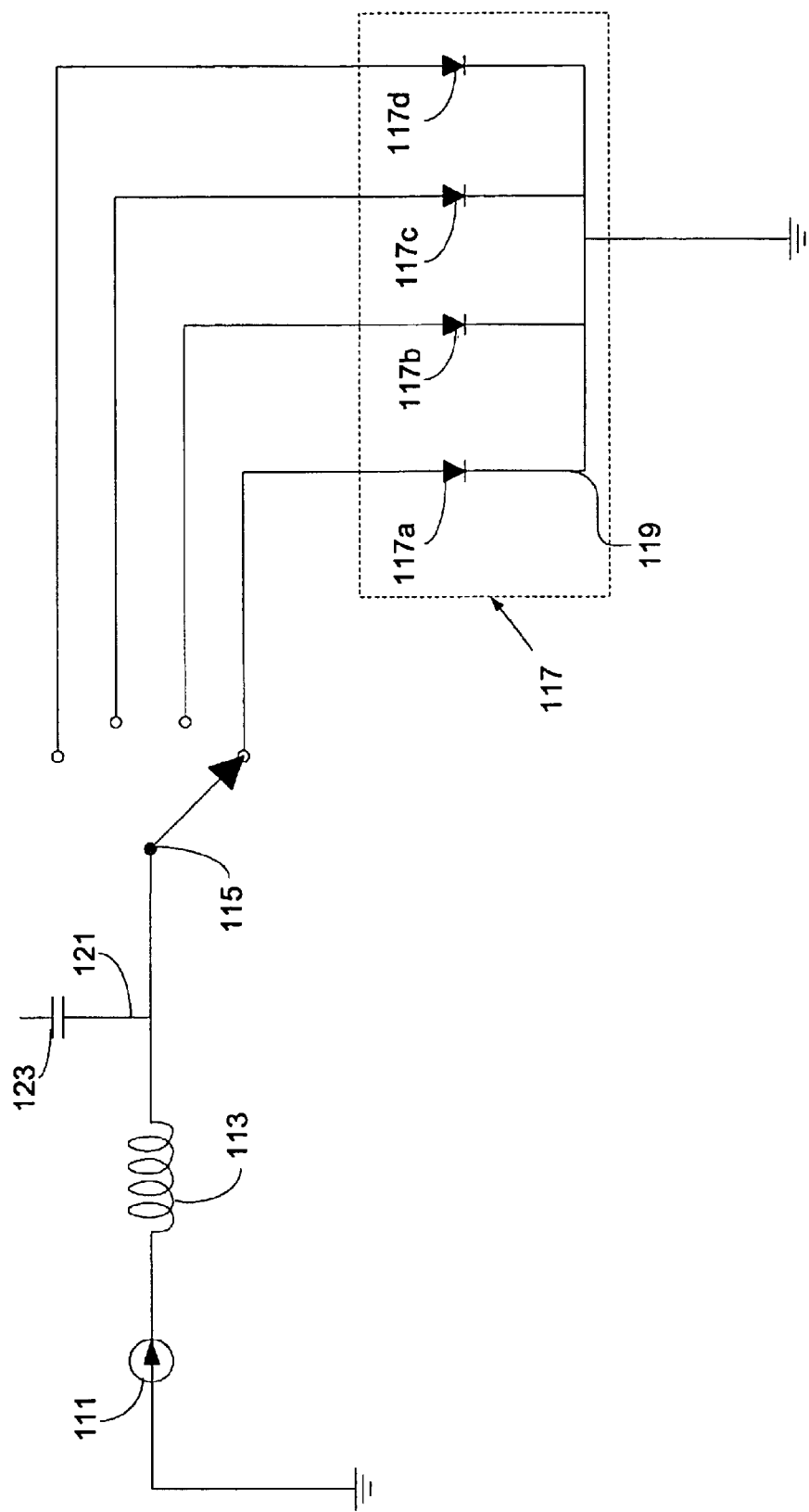
FIG. 1 illustrates a schematic of a system of an array of lasers provided a single high speed data signal.

FIG. 1 is a schematic of a system including an array of lasers. The array of lasers is provided a single high speed data signal, which is applied to a one of the lasers in the array of lasers. As illustrated in FIG. 1, a current source 111 provides a bias current. The bias current is passed through an inductor 113 to a first end of a switch 115. The switch has a second end coupled to a laser array 117. As illustrated, the laser array includes four lasers 117a–d, formed on a common substrate 119. The substrate is coupled to ground.

A high speed data signal is applied to the bias current prior to passing through the switch. As illustrated in FIG. 1, the high speed data signal is provided on a data signal line 121, which includes a capacitor 123. The high speed data signal modifies the signal formed by the bias current so as to form a data drive current which may be, for example, a low level current signal indicating a logical low and a higher level current signal indicating a logical high. In operation, the switch passes the data drive current to a one of the four lasers, laser 117a as illustrated, and the data drive current passes through the laser to the ground, causing the laser to operably lase in accordance with the data drive current. The other lasers are left open.

In the embodiment of FIG. 1 the switch may be a relatively low speed switch, but preferably passes the relatively high speed data drive current without undue distortion.

In an alternative embodiment a plurality of lasers are provided on a common substrate. The plurality of lasers are divided into groups, each group comprising a plurality of lasers. Each group includes elements as described above. Thus, for example, on a 12 laser array it is possible to have two 1×6 switches capable of directing high speed signals and 2 high speed drivers. In a further alternative embodiment, the data signal is switchably connected to electro-absorption modulators, with an electro-absorption modulator per laser.

Figure 2:
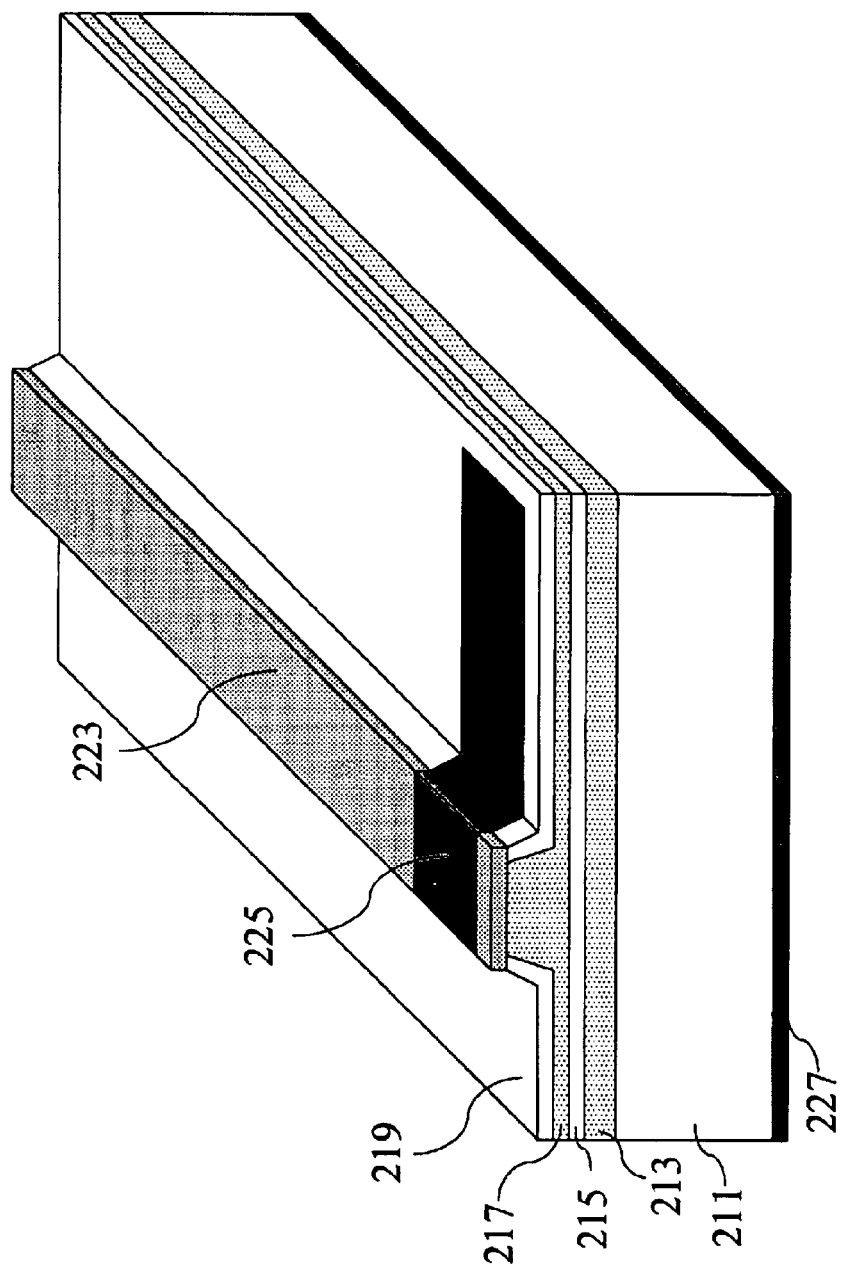
FIG. 2 illustrates an example laser of an array of lasers.

FIG. 2 illustrates a semiconductor waveguide laser. The laser of FIG. 2 may be used as a laser in the array of lasers of FIG. 1. In other embodiments other types of lasers are used. For example, in one embodiment the lasers in the array of lasers are VCSELs, DBR lasers, or other lasers. The laser of FIG. 2 is a simple ridge waveguide laser, though in other embodiments buried hetero-structure, buried rib, or other types of lasers are used. The laser epitaxial layers are grown on an n-type InP substrate 211. A first layer of the laser is an n-type epitaxially grown InP lower cladding layer 213, then an undoped InGaAsP quaternary active layer 215 comprising a quantum well and barrier layers, and then a top p-type InP cladding layer 217. The top p-type InP cladding layer is etched in the shape of a ridge using conventional photolithography. For a DFB laser, the growth is interrupted midway and a grating is etched into the laser (not shown). After the ridge is etched, the wafer is coated with an insulating dielectric 219, such as silicon nitride, with the dielectric removed on top of the ridge.

Metallization is applied to the top of the ridge, as shown by element 223. A second metallization step provides a contact regions 225, shown at the end of the stripe. The backside 227 of the substrate is also metallized to form an electrical contact. In operation, current flowing vertically through the laser, from the cladding layer 217 to the substrate contact 227, causes the laser to lase.

Figure 3:
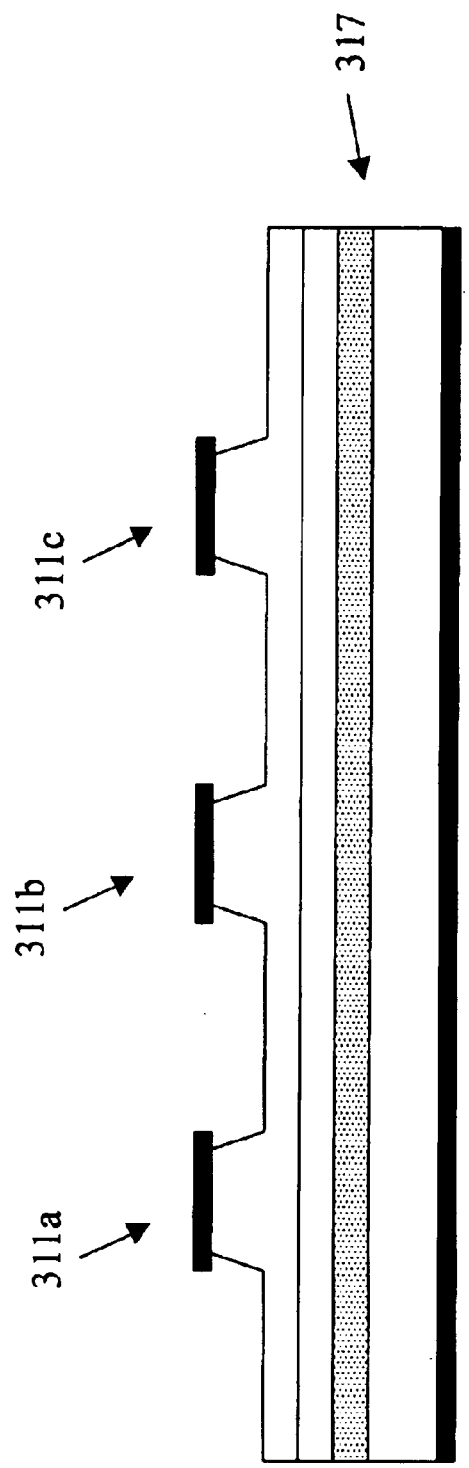
FIG. 3 illustrates an array of layers on a common substrate.

FIG. 3 illustrates an array of three ridge waveguide lasers 311a–c. Each of the lasers is formed on a common substrate layer 313, with the substrate layer including backside metallization forming a common contact. Each of the lasers also has metallization on top of their ridge.

Figure 4:
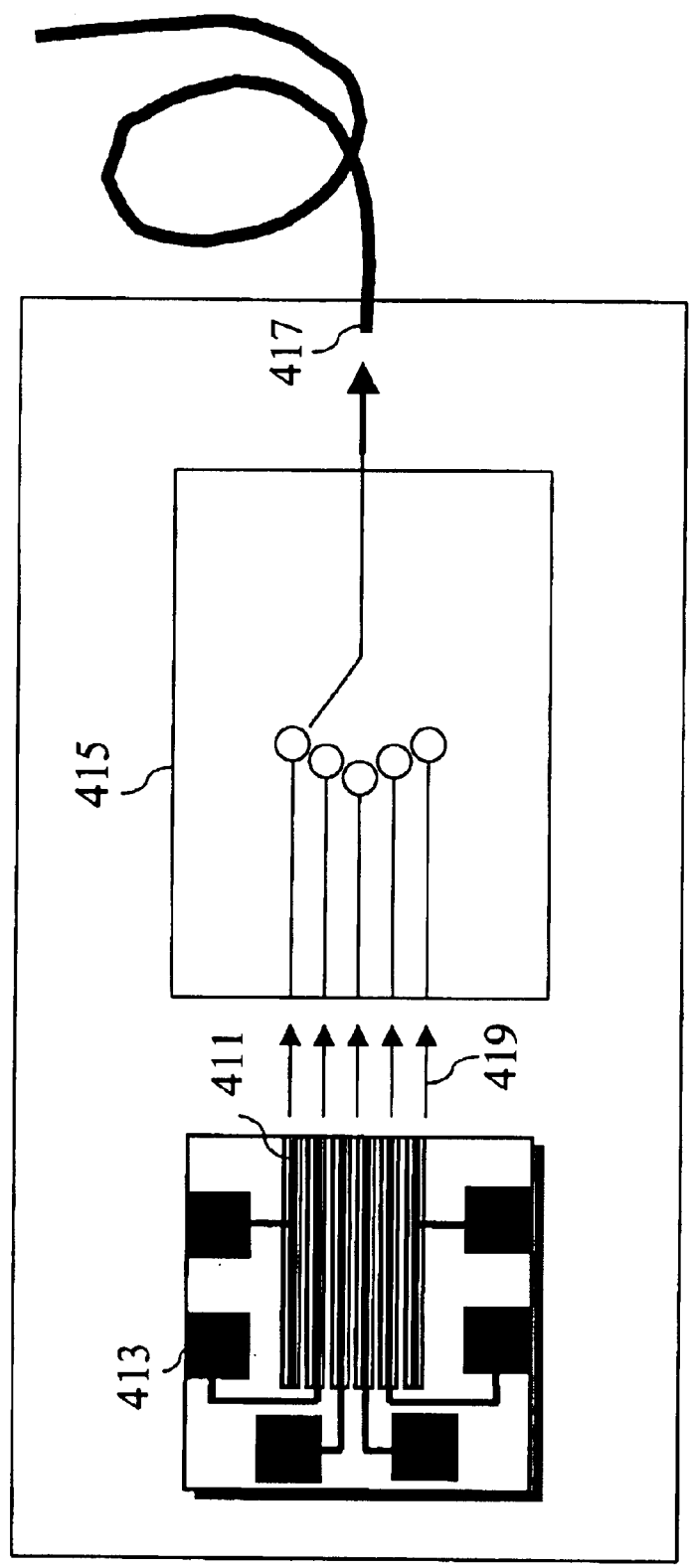
FIG. 4 illustrates a semi-block diagram of an embodiment of a laser system including an array of lasers on a common submount with an optical switch coupling light from a selected laser to an optical output.

FIG. 4 illustrates a device using an array of lasers 411, the array of lasers for example such as previously described. In the device of FIG. 4 the array of lasers is an array of single frequency lasers, such as distributed feedback (DFB) devices, on a semiconductor substrate. Each laser of the array of lasers is designed to operate at a different lasing wavelength. A number of techniques can be used to assign different wavelengths to each laser. These techniques include directly writing gratings with electron beam lithography, stepping a window mask during multiple holographic exposures, UV exposure through an appropriately fabricated phase mask, or changing the effective index of the mode of the lasers. Generally, for stable single mode characteristics, either a controlled phase shift is also included in the laser or gain/loss coupling is used in the grating. The wavelength of such lasers can be accurately controlled through dimensional variables, such as stripe width or layer thickness, and varied across the array.

A contact pad 413 is provided for injecting current into each of the lasers of the array of lasers. Light emitted from a laser is directed to an optical switch 415. The optical switch directs light from a one of the lasers to an optical output, illustrated in FIG. 4 as an optical fiber 417.

A variety of devices may be used as the optical switch. For example, the optical switch may be a MicroElectrical-Mechanical System (MEMS) mirror, which is translatable or rotatable along one, two, or more axis to direct light to the optical fiber. A system including such a mirror may be such as described in U.S. patent application Ser. No. 10/000,142, filed Oct. 30, 2001, entitled Tunable Controlled Laser Array, the disclosure of which is incorporated by reference herein. Other switching devices, such as described in International Patent Publication No. WO 02/13343 A2, published Feb. 14, 2002, the disclosure of which is incorporated by reference, may be used in various embodiments.

In operation, when current is injected into a laser of the array of lasers using, for example, contact pad 413, the laser emits radiation with a specific wavelength and from a particular position on the substrate, as represented by an arrow 419. In one embodiment, one laser is operated at a time, depending on the desired wavelength. Thus, as is described with respect to other figures, a switch may selectively provide a signal to a selected laser. The radiation or light from the lasers is transmitted to the optical switch. The optical switch has a number of states. In each particular state of a set of states, one of the input optical beams, i.e., light from one of the lasers, is transferred to the optical fiber.

Figure 5:
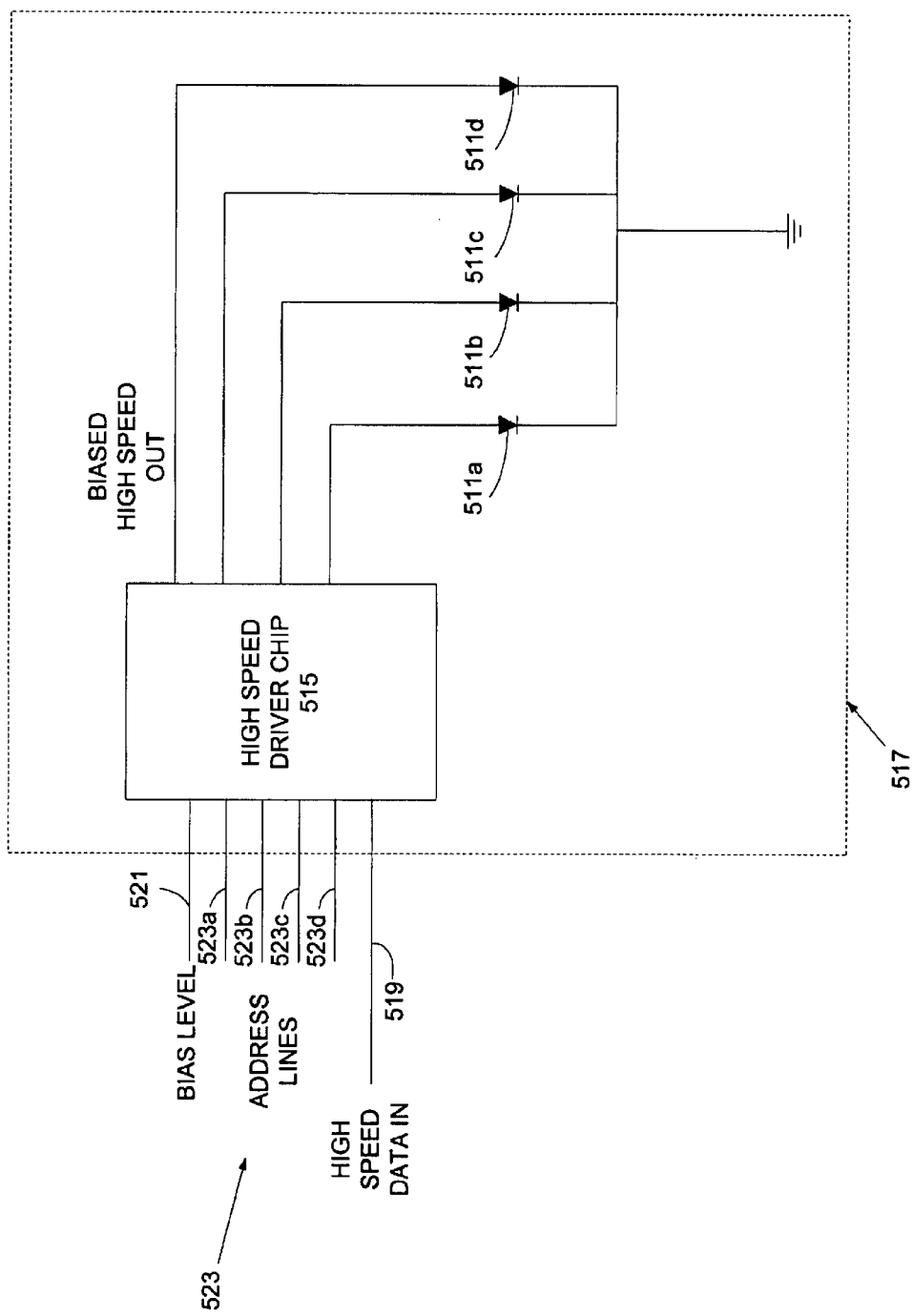
FIG. 5 is a semi-block diagram of an embodiment of a laser system including a high speed driver chip in accordance with aspects of the invention.

FIG. 5 is a block diagram of a further embodiment in accordance with aspects of the invention. An array of lasers on a common substrate includes, as illustrated, four laser

511*a–d*. The lasers are each provided high speed drive inputs 513*a–d*. The substrate is coupled to ground. The high speed drive inputs are provided by a high speed driver 515. In one embodiment the high speed driver is a semiconductor device flip-chipped to a submount for the array of lasers. This reduces the length of the high speed drive inputs to the array of lasers. The high speed driver and the array of lasers are mounted in a standard butterfly package 517.

The high speed driver is provided a high speed data signal 519, a bias level signal 521, and an address signal 523. The address signal as illustrated is provided by four input lines 523*a–d*, although in various embodiments the address signal may be provided by various numbers of lines, including a single line. The high speed driver provides a high speed output to a selected one of the lasers based on the address signal. Circuitry for performing this may accomplished in a variety of manners. For example, in some embodiments the high speed data signal may be provided to four lines in the high speed driver, with the output level of the four lines being dependent on a combination of the address signal and the bias level signal. In such an embodiment the bias level signal may be either a signal indicative of a desired bias level or the bias level. In another embodiment the bias level signal and the high speed data signal may be combined to form a signal corresponding to the high speed output, with a high speed demultiplexer resident in the high speed chip providing the high speed output to a selected laser, with the high speed output based on the signal corresponding to the high speed output. One of the advantages of the embodiment of FIG. 5 is that a low number of high speed signals, such as a single high speed signal, is provided to the generally hermetically sealed package. Such a consideration may be important, for example, when a line providing the high speed signal might be required to be specially routed or otherwise configured to reduce electromagnetic emissions or distortions in the high speed signal.

In some embodiments each of the lasers in the array of lasers is configured to lase at different wavelengths. Such an array of lasers may be used in a tunable laser structure, with the array of lasers at different wavelengths used to increase the tuning range of an output signal. For these structures, a laser close to the desired wavelength is turned on and then fine-tuned to the desired wavelength using, for example, traditional methods. In this way wide tuning can be achieved with the excellent performance of narrow tuning structures. The output from the multiple lasers is coupled to a single fiber using active techniques such as MEMS, thermo-optic, liquid crystal, or passive techniques such as couplers or combiners, which can be integrated with the laser chip.

Figure 6:
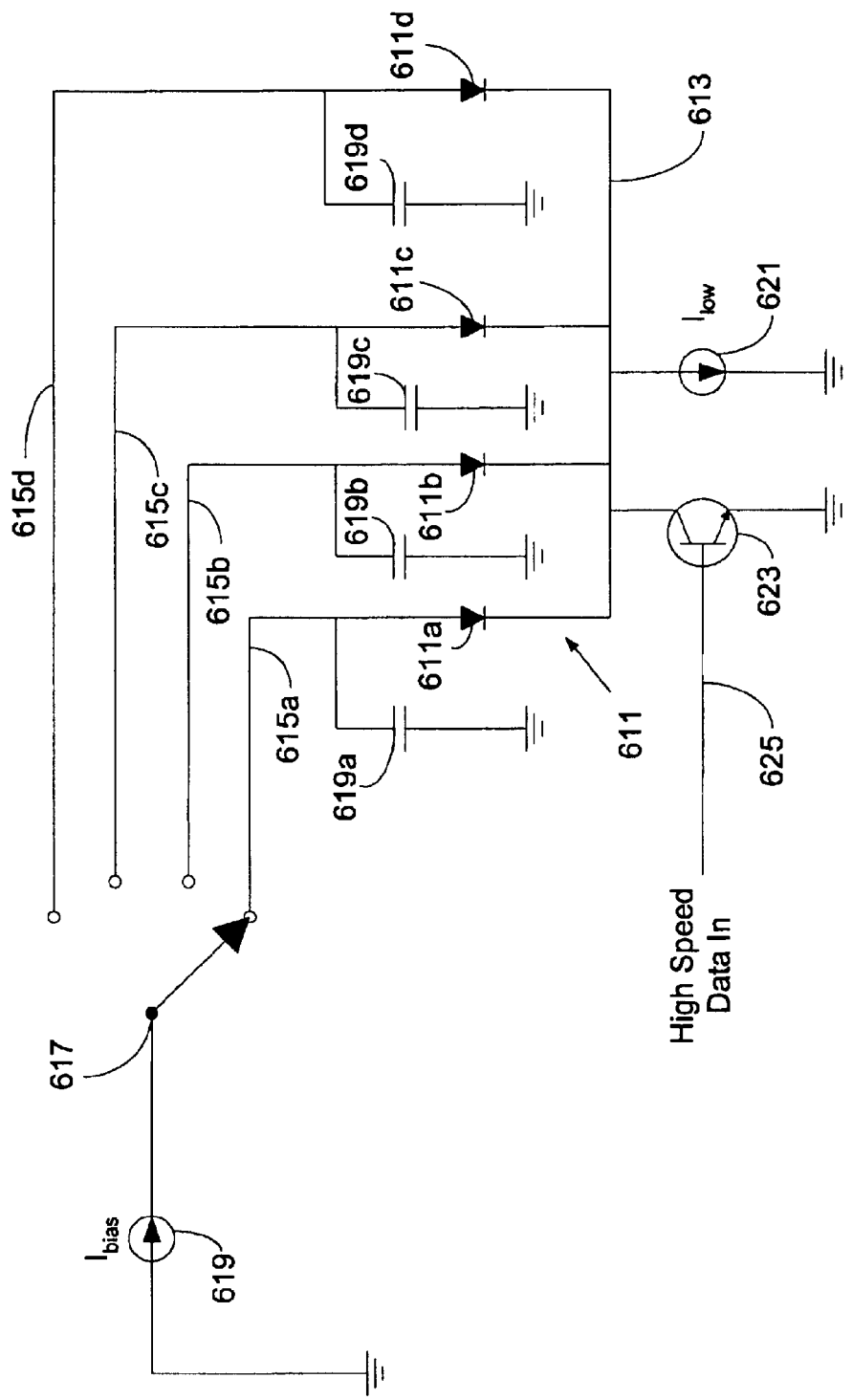
FIG. 6 is a semi-schematic of an open collector approach for driving a single laser of an array of lasers.

FIG. 6 is a block diagram of a further system in accordance with aspects of the invention. In the system of FIG. 6 an array of lasers 611 is formed on a common substrate 613. As illustrated in FIG. 6 the array of lasers comprises four lasers 611*a–d*. Each of the lasers is provided a drive line 615*a–d*. A switch 617 couples a bias current source 619 to a selectable one of the drive lines. The common substrate is coupled to ground through a low current source 621. The low current source provides sufficient current to maintain s the lasers at a logical low level, in which a laser slightly lases to improve laser response time.

The common substrate is also coupled to ground through a high speed switch 623. As illustrated, the high speed switch is a simple BJT transistor, with the collector of the transistor coupled to the substrate and the drain of the transistor coupled to ground. The gate of the transistor receives a high speed data signal 625. Other configurations of switches are also possible. For example, in many practical cases the high speed data signal may be a differential signal, with appropriate circuitry to receive the signal and couple the substrate to ground, or some low voltage.

In the embodiment of FIG. 6 a capacitor 627*a–d* is coupled to each of the drive lines, with another end of each capacitor coupled, for example, to ground. The capacitor provides a substantially constant bias voltage to the laser coupled to the bias current source at a given time. A possible advantage of the use of the capacitor is that the length of drive line adapted to appropriately transmit high speed signals may be reduced. For example, in the embodiment of FIG. 6, the portion of the line from the capacitor to the laser is adapted to appropriately transmit high speed signals, while the remainder of the drive line is not so adapted.

Thus, the switch 617 and associated wiring and circuitry in the embodiment of FIG. 6 is not designed for high speed operation and signals. Instead, the lengths of line between the capacitor and the laser, and the laser and the high speed switch 623 are designed for high speed. In addition, only one high speed switch is used for the array of lasers.

In one embodiment of the system of FIG. 6, the capacitance of the capacitor is such that the RC time constant of the capacitor and the series resistance of the associated laser is much longer than the expected maximum length of repeating 1 or 0 bits in the high speed data signal. In another embodiment, the capacitance of the capacitor is such that the RC time constant of the capacitor and the series resistance of the associated laser sets a corner frequency which is lower than the low frequency cutoff of the transmission system. For example, for a 2.5 Gb/s system with a laser series resistance of 6 ohm, the capacitor has a capacitance of 350 pF or greater.

Such a capacitor may be formed in an area of approximately 300 $\mu m^2$ using a single dielectric layer. The area used by the capacitor may be reduced if additional dielectric layers are used. Accordingly, in one embodiment the capacitors are provided on the semiconductor device forming the laser array. In an alternative embodiment the capacitors are provided on a submount to which the semiconductor device forming the laser array is mounted.

Figure 7:
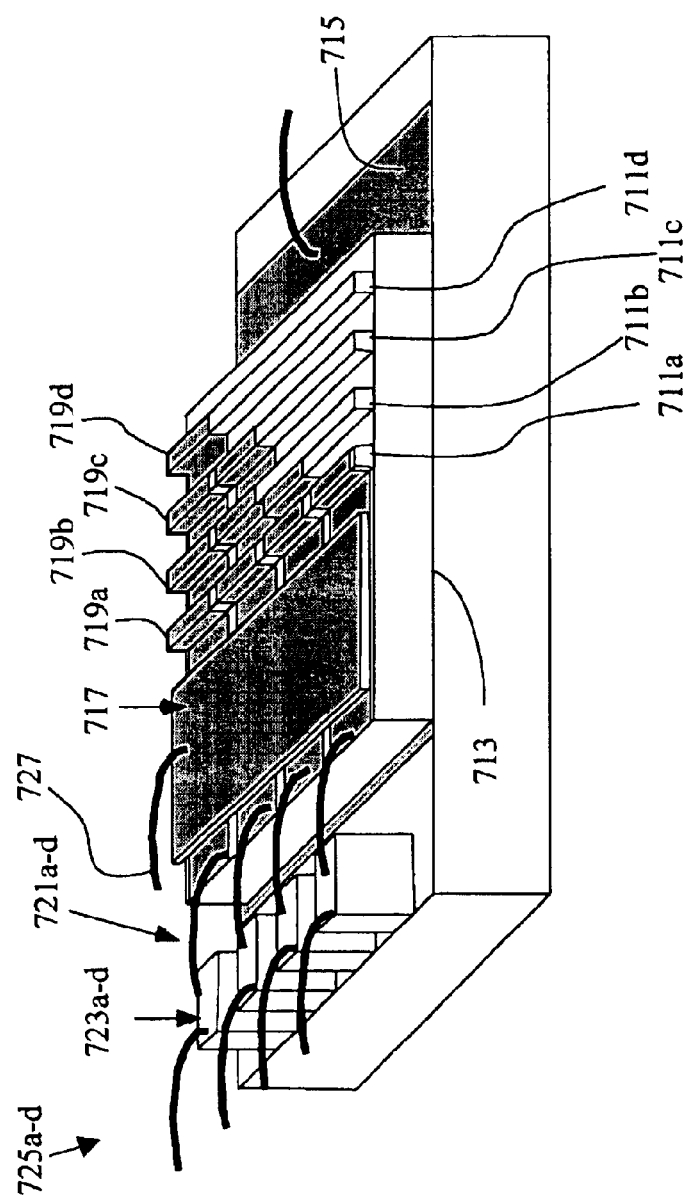
FIG. 7 illustrates an array of lasers including on-chip and external capacitance.

FIG. 7 illustrates a further device in accordance with aspects of the invention. In the device of FIG. 7 capacitance is provided both on a semiconductor device forming a laser array and on a submount to which the semiconductor device from the laser array is mounted. The device of FIG. 7 includes an array of lasers 711*a–d* formed on a common substrate 713. The substrate is electrically coupled to an electrical contact 715. The electrical contact is adapted for coupling to low bias current source and a high speed switch, with the low bias current source providing a low current for a laser logical low state and the high speed switch receiving a high speed data signal. Both the low bias current source and the high speed switch couple the substrate to, for example, ground.

An on-chip capacitance 717, forming a capacitor for each laser, is placed on the semiconductor material forming the array of lasers. One side of capacitors forming the on-chip capacitance is coupled by metallizations 719*a–d* to anodes of the lasers of the laser array. The one side of the capacitors are also coupled by connections 721*a–d* to external capacitors 723*a–d*. The external capacitors are mounted on the submount, which is generally ceramic. The external capacitors include a connection 725*a–d* to, for example, a switch coupling one of the external capacitors to a bias current source. The connections 725*a–d* are coupled to the same side of the external capacitors as the connections 723*a–d* to the on chip capacitors. The other side of the on-chip and external capacitors are coupled to ground by ground connections (727 for the on-chip capacitors, not shown for the external capacitors, but the side of the external capacitors mounted to the submount in some embodiments).

In the embodiment of FIG. 7 the external capacitors hold a laser selected for operation at a voltage, generally substantially constant, sufficient to drive the laser. Accordingly, in the embodiment of FIG. 7, the connections 723a–d from the on-chip capacitors to the lasers are adapted for high speed operation. The connections 725a–d, however, are medium speed connections, with for example the connections being rated for speeds up to a frequency determined by the RC time constant of the laser and capacitance.

In some applications parasitic capacitances may adversely impact overall system performance. Generally, for a devices described above parasitic capacitance affecting the high speed data signal may arise from driving the common substrate with a high speed signal, from the lasers in the logical low or off state, and from parasitic capacitance from the on-chip capacitors to ground.

Figure 8:
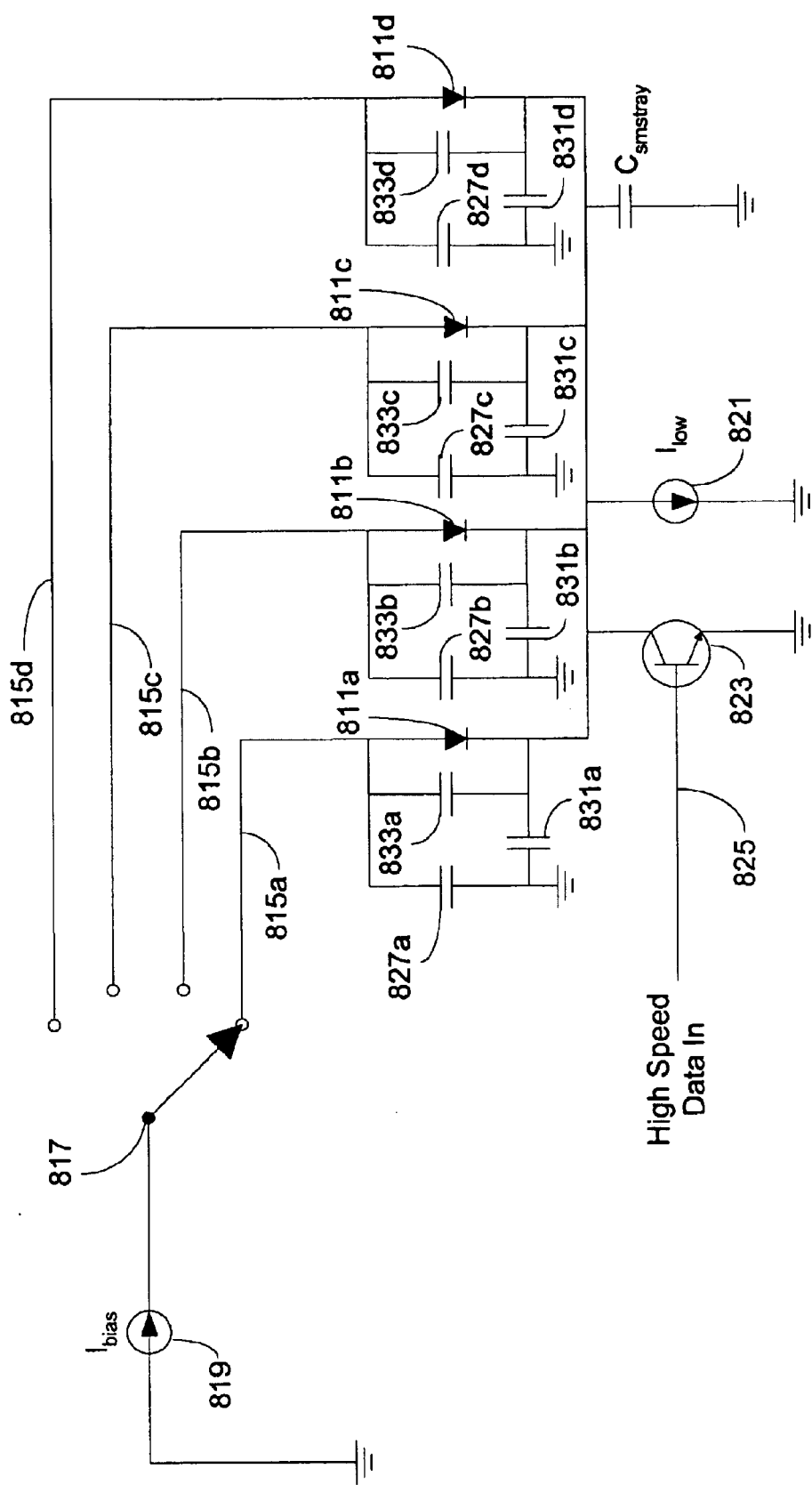
FIG. 8 is the semi-schematic of FIG. 6 redrawn to show parasitic capacitances.

FIG. 8 is the schematic of FIG. 6 redrawn to indicate parasitic capacitances affecting the high speed data signal. Accordingly, the schematic of FIG. 8 includes an array of lasers 811a–d formed on a common substrate 813, drive lines 815a–d, and a switch 817 coupling a bias current source 819 to the drive lines. The common substrate is coupled to ground through a low current source 821 and a high speed switch 823, which receives a high speed data signal 825. Capacitors 827a–d are coupled to each of the drive lines.

Also shown in the schematic are parasitic capacitances associated with the common substrate, the off lasers and on-chip capacitors. A common substrate parasitic capacitance 829 couples the common substrate to ground. In one embodiment the submount on which the common substrate is located is designed to reduce the common substrate parasitic capacitance to a level appropriate for system use. For example, for a 2.5 GHz application, with an array of twelve lasers, the submount and common substrate have a contact area of approximately 500×500 $\mu m^2$, with the common substrate separated from ground planes by 100 $\mu m$, resulting in a capacitance of approximately 0.1 pF.

Laser parasitic capacitances 831a–d are associated with each of the lasers, and couple the laser cathodes to a ground plane. In one embodiment the lasers have a capacitance of approximately 3 pF per laser, and the design of such lasers is know in the art.

On-chip parasitic capacitances 833a–d are associated with the on-chip capacitors, which may be viewed for this purpose as the common substrate. Accordingly, in various embodiments iron doping, thick dielectric layers, or polyimid layers are used to achieve a capacitance of approximately less than 1 pF per laser due to the on-chip parasitic capacitances.

In one embodiment an array of twelve lasers is provided. In accordance with the foregoing explanation, a total capacitance is less than 50 pF. For a laser resistance of six ohms, the RC time constant is up to appoximately 300 ps, which is suitable for 2.5 Gb/s systems.

Figure 9:
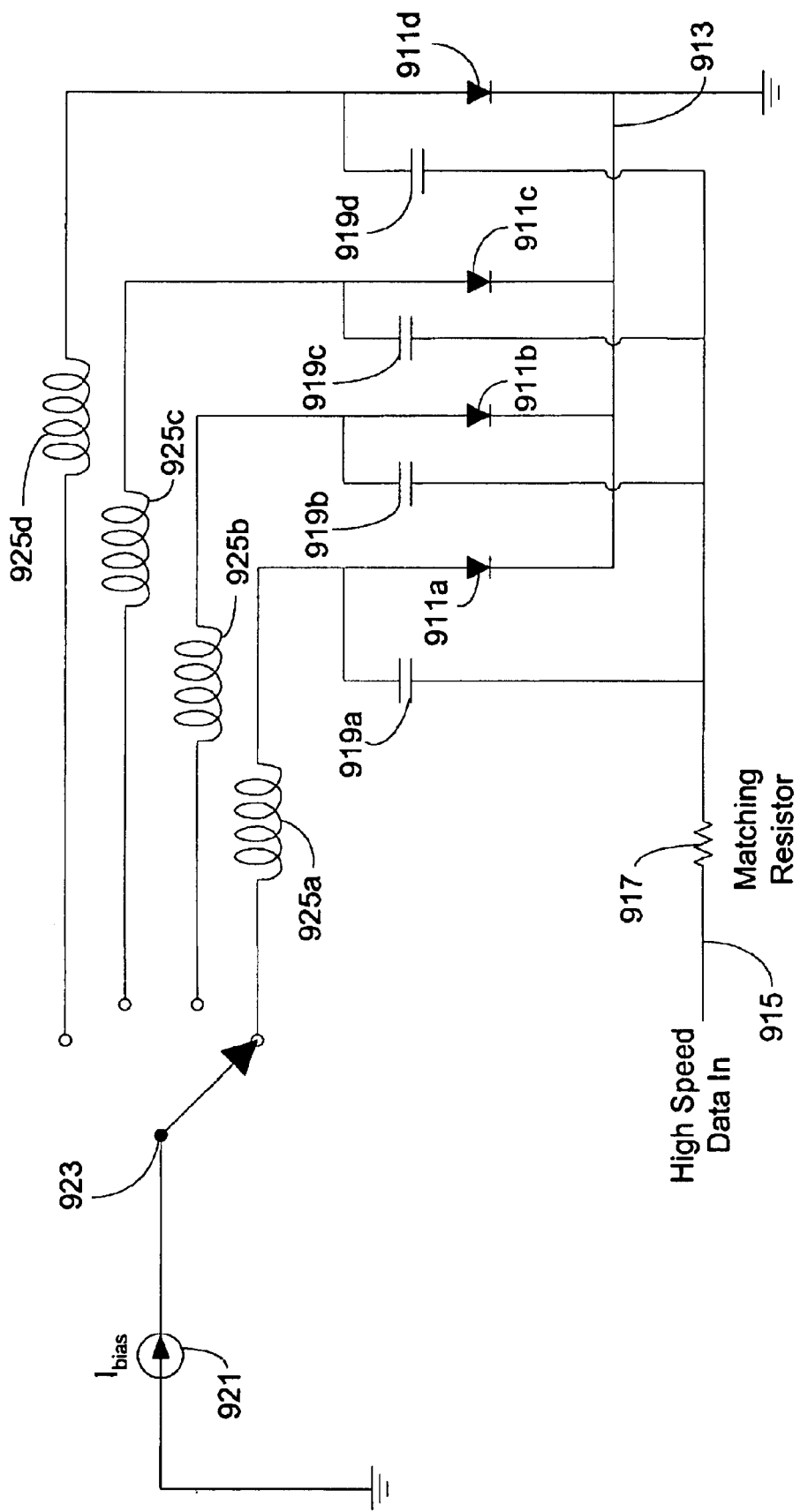
FIG. 9 is a semi-schematic of a bias-T approach for driving a single laser of an array of lasers.

FIG. 9 is a schematic of a device in accordance with aspects of the invention. The device of FIG. 9 includes an array of lasers 911a–d on a common substrate 913. The common substrate is coupled to ground. A high speed data signal is passed to the anodes of all of the lasers by a high speed transmission line 915 including a matching resistor 917 and a capacitor 919a–d for each laser.

A bias current is provided by a bias current source 921. The bias current is coupled to a one of the lasers by a switch 923, with inductors 925a–d placed between the switch and the lasers. Although illustrated as a single inductor, in various embodiments each illustrated inductor may be a plurality of inductors in series, for example, with preferably smaller inductors approximate the lasers.

Figure 10:
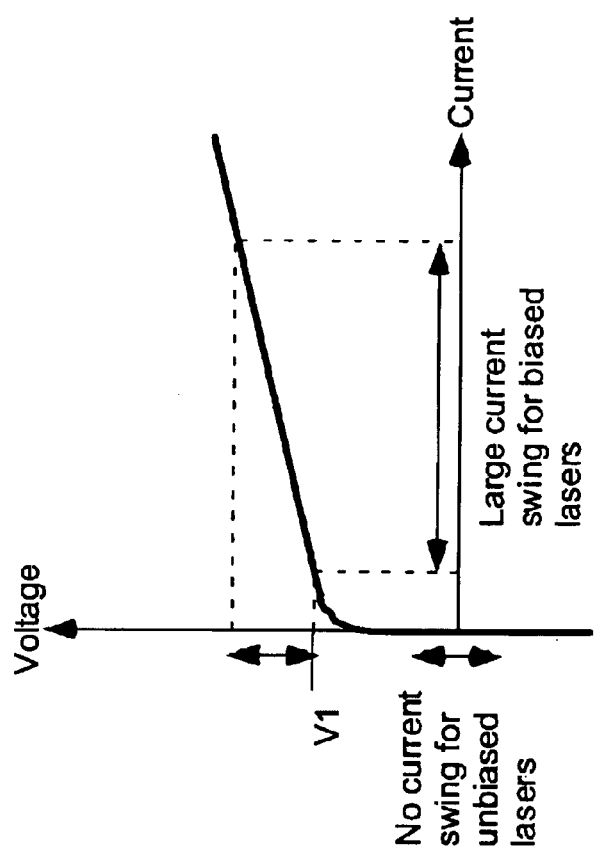
FIG. 10 is a graph showing voltage versus current for a laser.

In operation the laser selected by the switch is sufficiently forward biased to sufficiently change state to provide light levels corresponding to a logical high and low. For example, laser operation for the device of FIG. 9 may be understood with respect to graph of FIG. 10. The graph of FIG. 10 is a graph of voltage versus current for an example laser. For lasers biased below a first voltage level V1, generally the non-selected lasers, little current flows through the laser, and the laser accordingly does not exhibit significant changes in light output. For voltages above the first voltage level V1, however, small changes in voltage result in significant changes in current passing through the laser. Accordingly, a small voltage change applied to a laser biased above the first voltage level V1 results in a relatively large change in current flowing through the laser, with corresponding changes in light emission. Therefore, the high speed signal, although provided to all of the lasers, only induces a significant current flow in the laser selected by switch 923.

Figure 11:
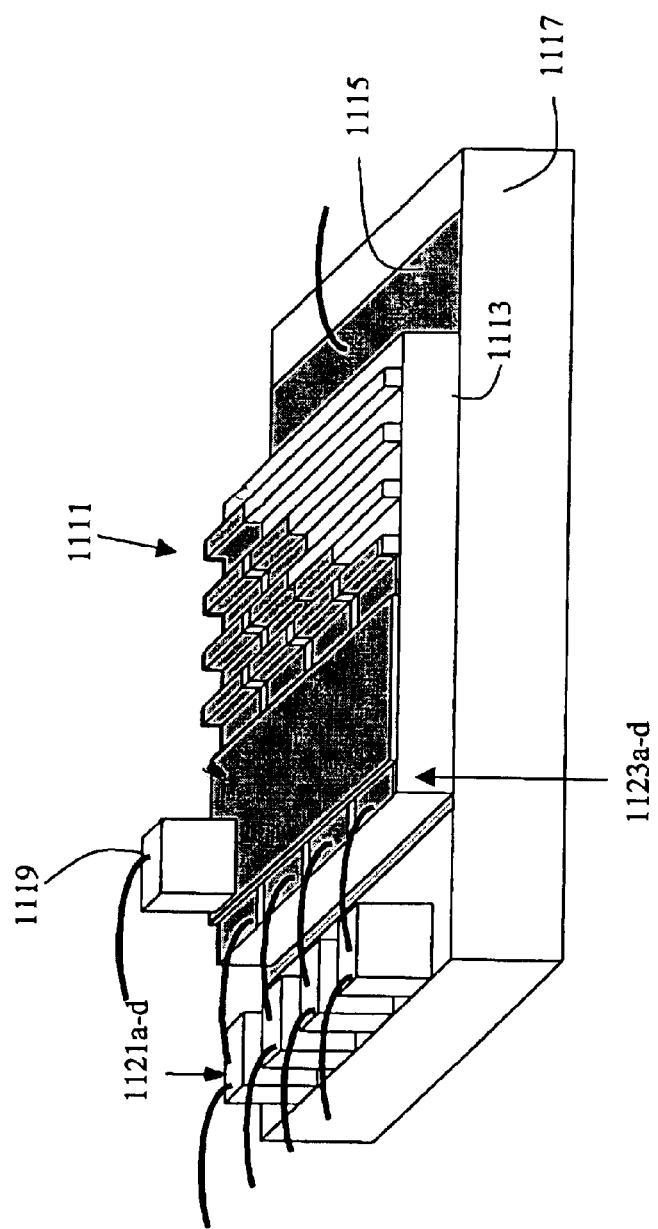
FIG. 11 illustrates a further array of lasers and on-chip and external capacitance.

FIG. 11 illustrates a device largely in accordance with the schematic of FIG. 9. The device of FIG. 11 includes a laser array 1111 having a common substrate 1113. The common substrate, including a contact 1115 is mounted on a submount 1117.

A high speed input line is provided to an end of a matching resistor 1119. The matching resistor has another end coupled to, mounted to as shown in FIG. 11, a capacitive coupling. The capacitive coupling provides a high speed signal on the high speed input line to capacitors 1123a–d mounted on the semiconductor device forming the laser array.

External inductors 1121a–d are mounted on the submount, although in other embodiments the inductors are spiral inductors directly patterned on to ceramic material of the submount or on the semiconductor device forming the laser array. In one embodiment, for example, the device is used in 2.5 Gb/s applications and the inductors are greater than 20 nH. The inductors are adapted to pass a bias signal to the lasers of the laser array by way of metallizations 1123a–d.

Figure 12:
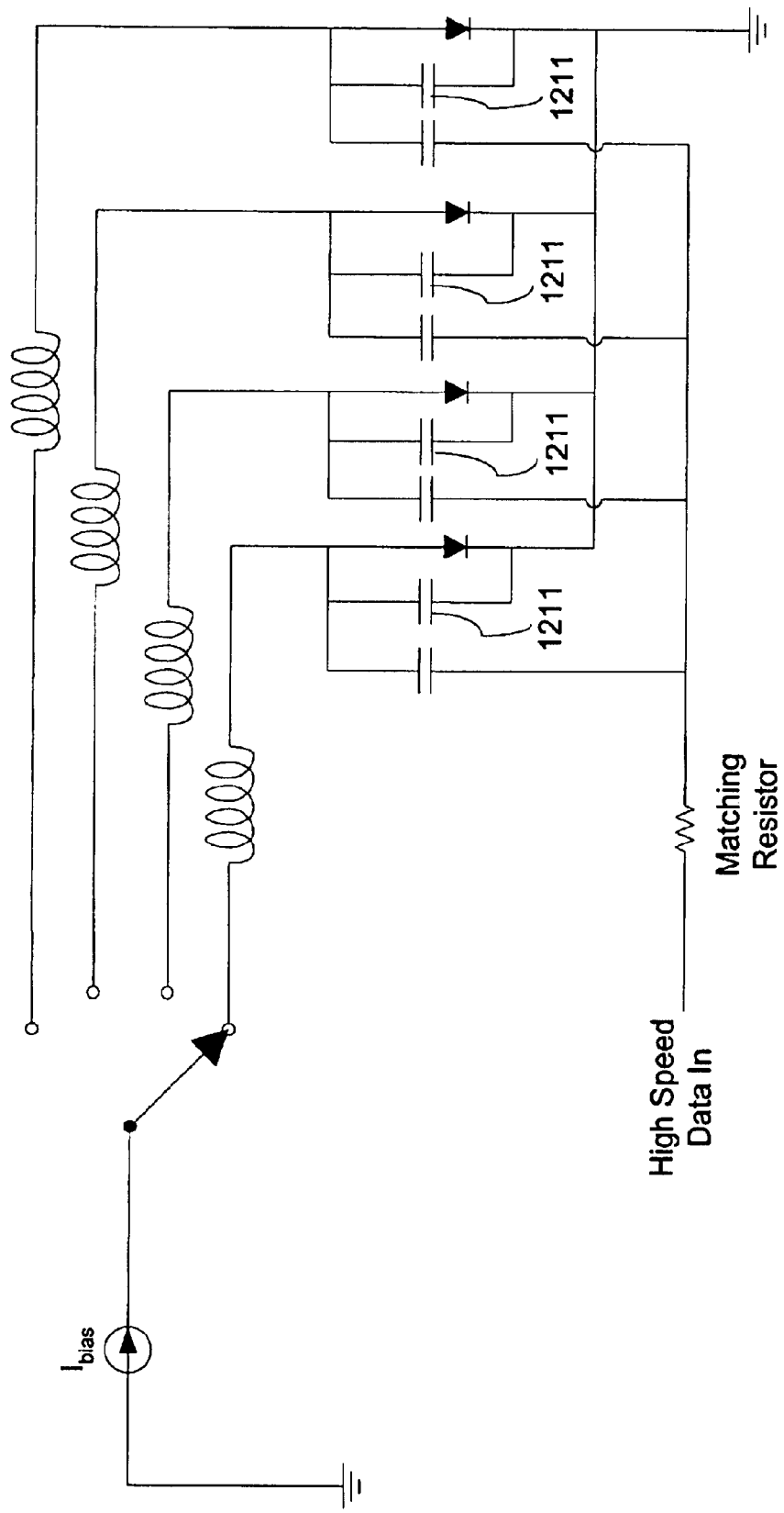
FIG. 12 is the semi-schematic of FIG. 9 redrawn to show parasitic capacitance.

FIG. 12 is FIG. 9 redrawn to illustrate parasitic capacitances which may be considered for the device, particularly parasitic capacitances which may adversely impact high speed operation of the device. As illustrated, FIG. 9 includes parasitic capacitances due to the unbiased lasers and parasitic capacitances to ground planes. The parasitic capacitances to ground planes may include capacitance from the on-chip capacitors to the ground plane formed by the common substrate. These parasitic capacitances may be viewed in sum as capacitors 1211 coupling each of the laser anodes to the common substrate.

In some embodiments the parasitic capacitances are reduced by use of lasers which have a capacitance of 3 pF and/or through the use of iron doping, thick dielectric layers, or poly-imid layers to reduce the capacitance from the on-chip capacitors to the common substrate.

Thus, the present disclosure describes a photonic device and aspects of such a device. Although the device, and aspects of the device, have been described in certain specific embodiments, it should be recognized that the inventions of this disclosure are the claims and their equivalents supported by this disclosure.

What is claimed is:

1. A photonic device comprising:
   an array of lasers on a common substrate, the lasers in the array of lasers are each designed to emit light at different wavelengths;
   a drive switch adapted to selectively provide a current to a laser of the array of lasers, causing a selected laser to lase;
   a data switch coupling the common substrate to a ground based on a high speed data signal received by the data switch; and
   a MicroElectrical-Mechanical System (MEMS) mirror, the MEMS mirror having a number of states, with light emitted from one of the lasers, the one of the lasers being the selected laser, transferred to an optical output for a particular state.

2. The photonic device of claim 1 wherein the array of lasers is mounted on a submount.

3. The photonic device of claim 2 wherein the drive switch is part of a drive circuit mounted on the submount.

4. The photonic device of claim 3 wherein the drive circuit receives the current, the high speed data signal, and a selection signal.

5. The photonic device of claim 4 where the selection signal is provided by a plurality of address lines.

6. The photonic device of claim 1 further comprising a low bias current source coupling the common substrate to ground.

7. The photonic device of claim 6 further comprising a capacitor for each laser, with one end of each capacitor coupled to the corresponding laser and the other end of each capacitor coupled to ground.

8. The photonic device of claim 7 wherein the one end of each capacitor is coupled to the corresponding laser by a line adapted for high speed signal transmission.

9. The photonic device of claim 8 wherein a drive line couples the current to each capacitor, the drive line not being adapted for high speed signal transmission.

10. The photonic device of claim 8 wherein each capacitor is mounted on a semiconductor device forming the array of lasers.

11. The photonic device of claim 8 wherein each capacitor comprises an on-chip capacitor and an external capacitor.

12. The photonic device of claim 11 wherein the on-chip capacitors are mounted on a semiconductor device forming the array of lasers.

13. The photonic device of claim 12 wherein the semiconductor device forming the array of lasers is mounted on a submount and the external capacitors are mounted on the submount.

14. The photonic device of claim 13 wherein the RC time constant of each capacitor and corresponding laser is much longer than the expected length of repeating logical low or logical high bits in the high speed data signal.

15. A drive circuit for a tunable laser, the tunable laser comprising an array of lasers, wherein each laser in the array of lasers is configured to lase at a different wavelength, the lasers being provided on a common substrate, light from a single selected laser being directed from a moveable mirror to couple to an optical output, the drive circuit operating to modulate the light from the single selected laser so as to carry a high speed data signal, the drive circuit comprising:
   a switch coupling the common substrate to a low voltage level when the switch is in a first state, the state of the switch depending on a data signal received by the switch; and
   a drive switch providing a drive signal to the single selected laser, based on a laser selection signal received by the drive switch, the drive signal charging a capacitor coupled to the selected laser, with the capacitor causing the single selected laser to lase when the switch couples the common substrate to a low voltage.

16. The drive circuit of claim 15 further comprising a low bias current source coupling the common substrate to the low voltage.

17. A drive circuit for a tunable laser, the tunable laser comprising an array of lasers, wherein each laser in the array of lasers is configured to lase at a different wavelength, the lasers being provided on a common substrate, light from a single selected laser being directed from a moveable mirror to couple to an optical output, the drive circuit operating to modulate the light from the single selected laser so as to carry a high speed data signal, the drive circuit comprising:
   a data line coupling a data signal to the lasers; and
   a drive switch providing a bias signal to the single selected laser, based on a laser selection signal received by the drive switch, the bias signal in combination with the data signal to lase in accordance with the data signal.

18. The drive circuit of claim 17 wherein the data line includes a capacitance for each laser, and the data signal is provided to the anodes of the lasers.

19. A photonic device comprising:
   an array of lasers, the lasers being semiconductor diode lasers, wherein the lasers of the array of lasers lase at different wavelengths, and whereby the wavelength of light from the photonic device may be tuned by selecting different lasers in the array of lasers;
   a switch to bias one of the lasers with a dc current such that the one of the lasers lases; and
   means to apply an ac data signal to all of the lasers, whereby current to the one of the lasers is modulated by the ac data signal and a MicroElectrical-Mechanical System (MEMS) mirror directing light from the one of the lasers to an optical output.

20. The photonic device of claim 19 where the lasers are distributed feedback lasers.

21. The photonic device of claim 19 where the output of the semiconductor diode lasers is coupled to a single fiber using a wavelength dispersive element.

22. The photonic device of claim 21 where the wavelength dispersive element is an arrayed waveguide device.

23. The photonic device of claim 19 lasers are distributed feedback lasers.

24. The photonic device of claim 19 wherein the lasers each have a first contact coupled together and to a high speed switch.

25. The photonic device of claim 24 wherein high speed switch connects the contacts to a substantially fixed voltage based on the state of the ac data signal.

26. The photonic device of claim 25 wherein the lasers each have a second contact are selectively coupled to a biasing circuit by a switch, with at most a one of the second contacts coupled the biasing circuit for a given state of the switch.

27. The photonic device of claim 26 wherein capacitance are connected between each of the second contacts and a fixed voltage, whereby a voltage of said second contacts may be maintained at a substantially fixed level.

28. The photonic device of claim 27 wherein a high speed connection is provided between the capacitance and the second contacts.

29. The photonic device of claim 28 wherein at least some of the capacitance are capacitors are fabricated on a semiconductor device forming the array of lasers.

30. The photonic device of claim 29 wherein the capacitors fabricated on the semiconductor device forming the array of lasers chip is formed of conductive layers separated by a thin dielectric material.

31. The photonic device of claim 19 where a first contact of the lasers is connected to a fixed voltage source.

32. The photonic device of claim 31 where second contacts of the lasers are connected by capacitors to the ac data signal.

33. The photonic device of claim 32 where the second contacts are also each connected through an inductance associated with each second contact to a 1×N switch, which connects a selected laser to the dc current.

34. The photonic device of claim 33 where some of said inductors are spiral inductors fabricated by patterning material to which lasers are mounted.

35. The photonic device of claim 33 where some of the capacitors are fabricated on the semiconductor diode laser chip using conductive layers separated by a dielectric.

36. The photonic circuit of claim 33 wherein the capacitors are fabricated on material to which the semiconductor is mounted using conductive layers separated by a dielectric.

37. The photonic circuit of claim 33 where a matching resistor is used to match the impedance of a data line carrying the ac data signal.

38. A photonic device comprising:
an array of lasers on a common substrate;
a drive switch adapted to selectively provide a current to a laser of the array of lasers, causing a selected laser to lase;
a data switch coupling the common substrate to a ground based on a high speed data signal received by the data switch; and
a MicroElectrical-Mechanical System (MEMS) mirror, the MEMS mirror having a number of states, with light emitted from the selected laser transferred to an optical output for a particular state of the MEMS mirror.

39. The photonic device of claim 38 wherein the array of lasers is mounted on a submount.

40. The photonic device of claim 39 wherein the drive switch is part of a drive circuit mounted on the submount.

41. The photonic device of claim 40 wherein the drive circuit receives the current, the high speed data signal, and a selection signal.

42. The photonic device of claim 41 where the selection signal is provided by a plurality of address lines.

43. The photonic device of claim 38 further comprising a low bias current source coupling the common substrate to ground.

44. The photonic device of claim 43 further comprising a capacitor for each laser, with one end of each capacitor coupled to the corresponding laser and the other end of each capacitor coupled to ground.

45. The photonic device of claim 44 wherein the one end of each capacitor is coupled to the corresponding laser by a line adapted for high speed signal transmission.

46. The photonic device of claim 45 wherein a drive line couples the current to each capacitor, the drive line not being adapted for high speed signal transmission.

47. The photonic device of claim 45 wherein each capacitor is mounted on a semiconductor device forming the array of lasers.

48. The photonic device of claim 45 wherein each capacitor comprises an on-chip capacitor and an external capacitor.

49. The photonic device of claim 48 wherein the on-chip capacitors are mounted on a semiconductor device forming the array of lasers.

50. The photonic device of claim 49 wherein the semiconductor device forming the array of lasers is mounted on a submount and the external capacitors are mounted on the submount.

51. The photonic device of claim 50 wherein the RC time constant of each capacitor and corresponding laser is much longer than the expected length of repeating logical low or logical high bits in the high speed data signal.

52. A photonic device comprising:
an array of lasers on a common substrate, the lasers in the array of lasers are each designed to emit light at different wavelengths;
a drive switch adapted to selectively provide a current to a laser of the array of lasers, causing a selected laser to lase; and
a data switch coupling the common substrate to a ground based on a high speed data signal received by the data switch and a MicroElectrical-Mechanical System (MEMS) mirror directing light from the selected lasers to an optical output.

53. The photonic device of claim 52 wherein the array of lasers is mounted on a submount.

54. The photonic device of claim 53 wherein the drive switch is part of a drive circuit mounted on the submount.

55. The photonic device of claim 54 wherein the drive circuit receives the current, the high speed data signal, and a selection signal.

56. The photonic device of claim 55 where the selection signal is provided by a plurality of address lines.

57. The photonic device of claim 52 further comprising a low bias current source coupling the common substrate to ground.

58. The photonic device of claim 57 further comprising a capacitor for each laser, with one end of each capacitor coupled to the corresponding laser and the other end of each capacitor coupled to ground.

59. The photonic device of claim 58 wherein the one end of each capacitor is coupled to the corresponding laser by a line adapted for high speed signal transmission.

60. The photonic device of claim 59 wherein a drive line couples the current to each capacitor, the drive line not being adapted for high speed signal transmission.

61. The photonic device of claim 59 wherein each capacitor is mounted on a semiconductor device forming the array of lasers.

62. The photonic device of claim 59 wherein each capacitor comprises an on-chip capacitor and an external capacitor.

63. The photonic device of claim 62 wherein the on-chip capacitors are mounted on a semiconductor device forming the array of lasers.

64. The photonic device of claim 63 wherein the semiconductor device forming the array of lasers is mounted on a submount and the external capacitors are mounted on the submount.

65. The photonic device of claim 64 wherein the RC time constant of each capacitor and corresponding laser is much longer than the expected length of repeating logical low or logical high bits in the high speed data signal.

* * * * *